United States Patent [19]
McEwan

[11] Patent Number: 5,630,216
[45] Date of Patent: May 13, 1997

[54] MICROPOWER RF TRANSPONDER WITH SUPERREGENERATIVE RECEIVER AND RF RECEIVER WITH SAMPLING MIXER

[75] Inventor: Thomas E. McEwan, Livermore, Calif.

[73] Assignee: The Regents of the University of California, Oakland, Calif.

[21] Appl. No.: 300,765

[22] Filed: Sep. 6, 1994

[51] Int. Cl.$^6$ .................................................... H04B 1/16
[52] U.S. Cl. ...................... 455/215; 455/318; 455/336; 455/84; 329/344; 329/323
[58] Field of Search ...................... 455/336, 84, 313, 455/318–320; 340/825.54; 329/318, 323, 339, 334, 344; 375/316, 338, 339, 340, 214, 15

[56] References Cited

U.S. PATENT DOCUMENTS

| | | | |
|---|---|---|---|
| 3,054,056 | 9/1962 | Yost, Jr. | 455/336 |
| 4,143,324 | 3/1979 | Davis | 455/336 |
| 4,307,465 | 12/1981 | Geller | 375/76 |
| 4,393,514 | 7/1983 | Minakuchi | 455/336 |
| 4,455,682 | 6/1984 | Masters | 455/300 |
| 4,749,964 | 6/1988 | Ash | 331/107 |
| 4,786,903 | 11/1988 | Grindahl et al. | |
| 5,029,271 | 7/1991 | Meierdierck | 329/347 |

Primary Examiner—Reinhard J. Eisenzopf
Assistant Examiner—Philip J. Sobutka
Attorney, Agent, or Firm—Henry P. Sartorio

[57] ABSTRACT

A micropower RF transdponder employs a novel adaptation of the superregenerative receiver wherein the quench oscillator is external to the regenerative transistor. The quench oscillator applies an exponentially decaying waveform rather than the usual sinewave to achieve high sensitivity at microampere current levels. Further improvements include circuit simplifications for antenna coupling, extraction of the detected signal, and a low-voltage bias configuration that allows operation with less than a 1-volt rail voltage. The inventive transponder is expected to operate as long as the battery shelf life.

20 Claims, 7 Drawing Sheets

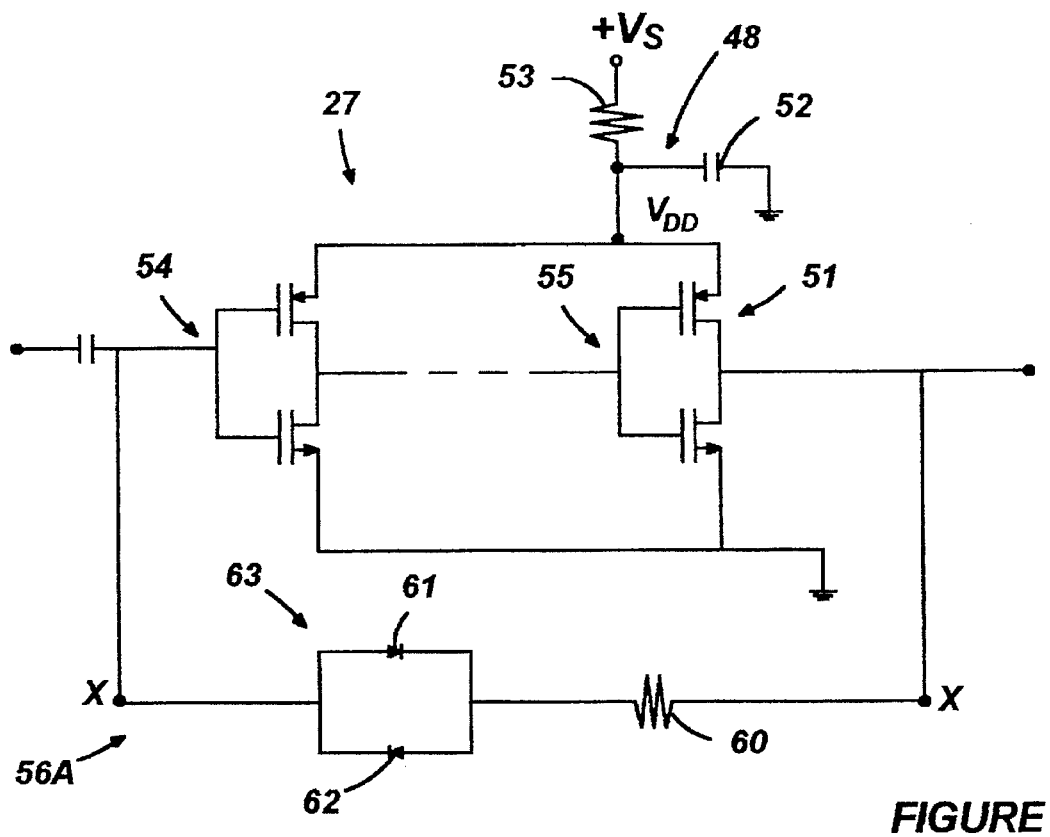
*FIGURE 4A*
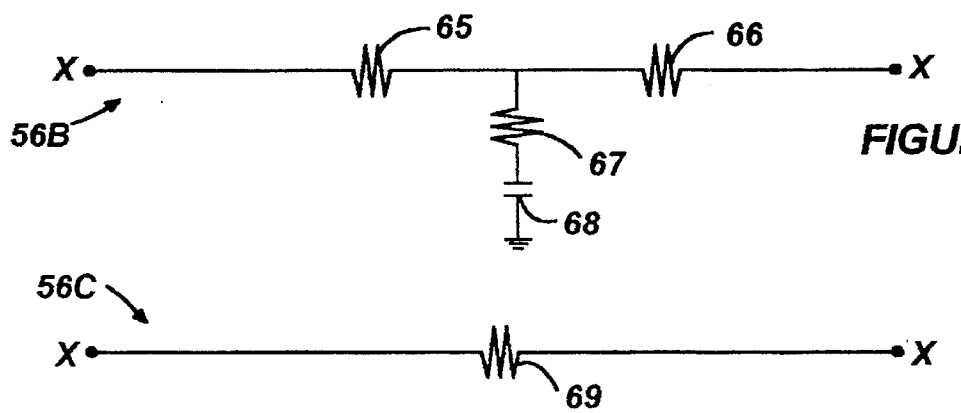
*FIGURE 4B*
*FIGURE 4C*

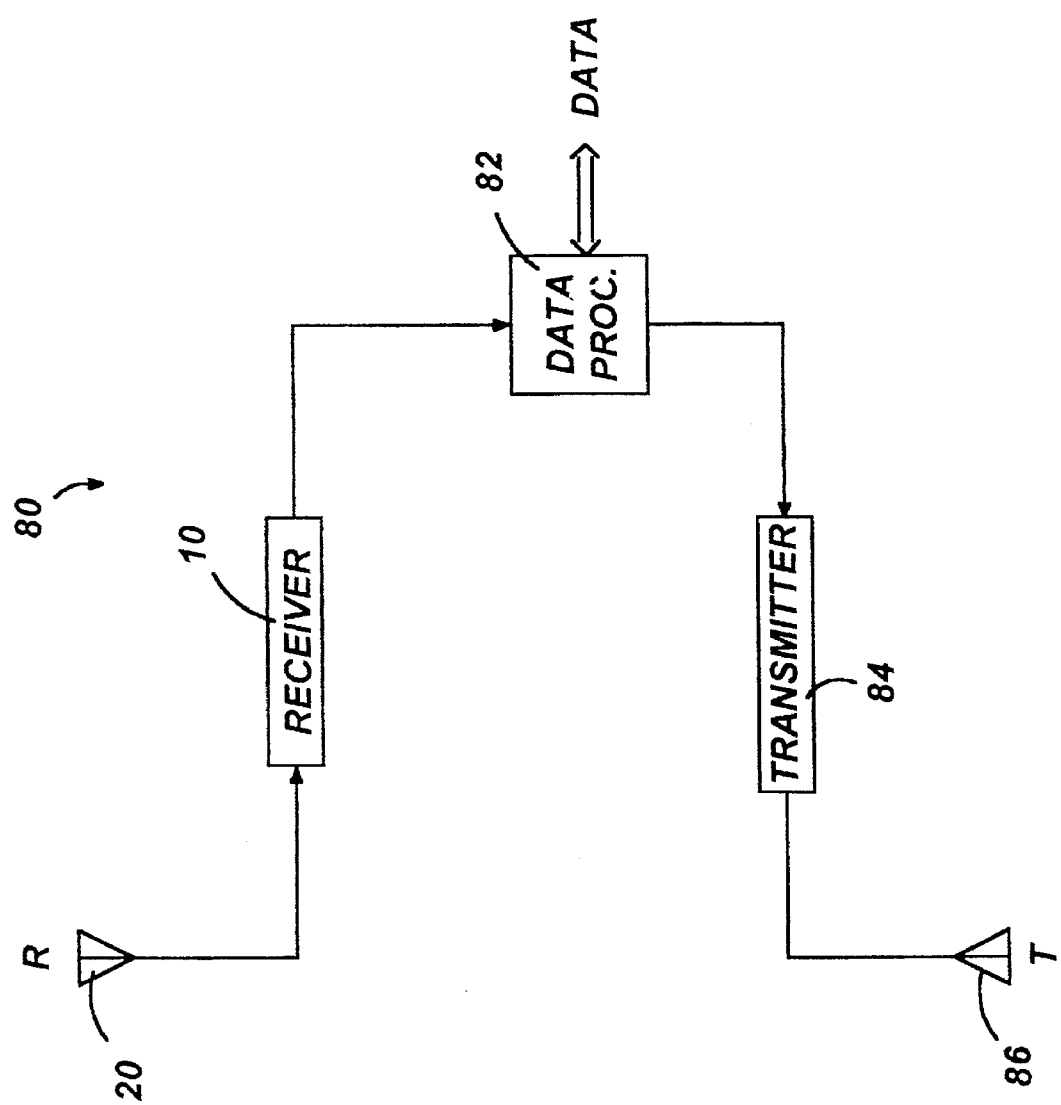

MICROPOWER RF TRANSPONDER WITH SUPERREGENERATIVE RECEIVER AND RF RECEIVER WITH SAMPLING MIXER

STATEMENT OF GOVERNMENT RIGHTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates in general to radio frequency (RF) transponders. More particularly, this invention relates to a new superregenerative micropower RF receiver adaptable for use as a wireless receiver of a remote control system, and as a remotely interrogated RF transponder.

Superregenerative type radio receivers are commonly employed in high frequency, low power reception of radio signals, such as may be typically used in automotive garage door openers, portable telephones, remote meter reading systems, and the like, because of their small size, ease and economy of construction. Most manufacturers of superregenerative receivers aim at designing very low power consumption units, and for mass producing these units at a low cost. Typically, the entire radio receiver circuit includes one or several inductive elements in addition to the antenna, and is contained on a single circuit board. The various forms and types of superregenerative radio receivers that have heretofore been suggested and employed in the industry have met with varying degrees of success, particularly because of the limitation on the inherent power consumption of these receivers.

A superregenerative receiver or detector is a regenerative circuit in which an oscillator is automatically switched between an oscillating state and a non-oscillating state at a lower rate than the radio frequency. The switching frequency is referred to as the "quenching frequency". The signal voltage to be detected is connected to a feedback loop which is connected to a transistor amplifier to cause oscillation.

In the absence of an applied voltage, the oscillation that builds up during each cycle of the quench voltage starts with an initial amplitude determined by the noise voltages in the input circuit and reaches a final value corresponding to the equilibrium value for the oscillation. These oscillations then fade as the quench voltage prevents oscillating conditions.

More specifically, a conventional superregenerative receiver typically includes an antenna and a superregenerative detector responsive to an incoming signal received at the antenna. It further includes a buffer amplifier for amplifying the received signal, a quench oscillator and a low-pass filter. The quench oscillator also serves as a detector, and the output of the quench oscillator is derived as a low frequency signal through the low-pass filter. This low frequency signal is fed to a signal level detector through a low frequency amplifier and a bandpass filter. When the resultant low frequency signal is above a given level, the signal level detector provides an indication that the signal has been introduced to the receiver.

A conventional quench oscillator generally includes one transistor and operates in the following manner. When the transistor is in transition from its conductive state to its non-conductive state, the collector voltage of the transistor increases gradually according to a charging time constant. The varying collector voltage of the transistor is fed to its emitter via a capacitor. If the collector voltage reaches its maximum, i.e., if the current flowing through an oscillating inductor of the quench oscillator is reduced to a minimum, then the base of the transistor is supplied with the bias voltage to turn the transistor conductive by virtue of the counterelectromotive force developed by the oscillating inductor. The transistor therefore becomes conductive abruptly.

Once the transistor becomes conductive, the oscillating inductor causes a counterelectromotive force to render the transistor non-conductive, and the collector voltage of the transistor rises gradually. In this manner, the transistor is repeatedly switched between the conductive and non-conductive states so as to initiate oscillation. In response to such switching, a tuning circuit produces a transient variation in voltage and current. Under these circumstances, the output of the buffer amplifier is applied to the tuning circuit to perform a sort of a mixing operation. A modulated signal originating from this mixing operation is supplied to the low-pass filter.

Continuous developments are being attempted to improve on existing superregenerative receivers. Examples of such superregenerative receivers and the trend of their development are illustrated in the following patents, all of which are incorporated herein by reference:

| U.S. Pat. No. | Patentee | Issue Date |
| --- | --- | --- |
| U.S. Pat. No. 3,883,809 | Ver Planck et al. | May 13, 1975 |
| U.S. Pat. No. 4,143,324 | Davis | March 6, 1979 |
| U.S. Pat. No. 4,307,465 | Geller | December 22, 1981 |
| U.S. Pat. No. 4,393,514 | Minakuchi | July 12, 1983 |
| U.S. Pat. No. 4,455,682 | Masters | June 19, 1984 |
| U.S. Pat. No. 4,749,964 | Ash | June 7, 1988 |
| U.S. Pat. No. 4,786,903 | Grindahl et al. | November 22, 1988 |
| U.S. Pat. No. 5,029,271 | Meierdierck | July 2, 1991 |

The Ver Planck et al. patent is entitled "Superregenerative Mixers and Amplifiers", and describes a superregenerative circuit including a tunnel diode. This tunnel diode serves to amplify a radio-frequency input signal and to mix the input signal with a local oscillation to provide an intermediate-frequency output. The local oscillation is a harmonic of the quench-frequency oscillation applied to the tunnel diode to produce superregeneration.

The Davis patent is entitled "Transistorized Superregenerative Radio Frequency Detector" and illustrates a transistorized superregenerative radio frequency detector which utilizes neither biasing circuits nor a base decoupling capacitor. The detector is self-quenching and operates at a much higher quenching frequency than was the case for conventional superregenerative detectors.

The Geller patent is entitled "Digital Communications Receiver", and describes a receiving apparatus for receiving and detecting binary encoded continuous wave RF signals. The binary signal is detected by a superregenerative detector. The detected signal and a DC reference voltage are applied to an amplifier which produces a signal corresponding to the detected signal but shifted to vary in amplitude about an axis at the DC reference voltage. The shifted signal and the DC reference voltage are applied to a comparator which produces an output signal at a predetermined voltage lever when the shifted signal is greater than the DC reference voltage and at 0 volts when the shifted signal is less than the DC reference voltage.

The Minakuchi et al. patent is entitled "Superregenerative Receiver" and illustrates a superregenerative receiver which includes a quenching oscillator for converting a received signal into a low frequency signal. The quenching oscillator comprises a transistor, a positive feedback circuit and an RC time constant circuit. A circuit is provided for modifying oscillation conditions including the base voltage and the RC time constant of the RC circuit.

The Masters patent is entitled "Superregenerative Radio Receiver" and describes a superregenerative type radio receiver that is particularly adapted for avoiding frequency shift of the receiver from a preselected tuned frequency. The receiver comprises a superregenerative radio circuit and an associated antenna mounted on a circuit board and received in a container including a wall portion reflective to radio transmissions. The radio receiver is adapted to be installed near metallic items and maintain tuned frequency stability.

The Ash patent is entitled "Superregenerative Detector Having a Saw Device in the Feedback Circuit", and describes a superregenerative detector utilizing a single transistor and having a surface acoustic wave device in the feed back loop coupling the output to the input to cause oscillation.

The Grindahl et al. patent is entitled "Remotely Interrogated Transponder" and illustrates a remotely interrogated transponder which generally includes an oscillator circuit, a detector, a demodulator and a logic circuit. The oscillator circuit includes a Colpitts oscillator including a parallel tuned tank load capacitively fed back to an amplifying transistor. The tuned tank is comprised of a shortened half wavelength section of microstrip. An external quench circuit comprises an npn bipolar junction switching transistor. This switching transistor is connected to the source of the amplifying transistor. The external quench circuit is provided to periodically turn OFF the amplifying transistor, allowing the oscillations in the tuned bank to die out.

The Meierdierck patent is entitled "Superregenerative Detector" and describes an improved superregenerative detector including input elements for receiving a high frequency carrier signal having an amplitude envelope upon which an information signal is impressed. The detector also includes a first and a second oscillators and output elements for producing an output signal corresponding to the information signal. The detector features the use of feedback components among the output elements. These feedback components include an operational amplifier and reference signal connected to the first and second oscillators such that the output signal of the operational amplifier may be used to constrain a transistor that defined the first amplifier to operate within its linear portion.

These types of superregenerative receivers are generally simple and relatively economical. However, they suffer from severe disadvantages. In the first place, even when applied signals are absent, most of these receivers are continuously turned ON, and therefore have a relatively high power consumption, which minimizes their usefulness and limits their applications. Furthermore, in order for the oscillating circuit to oscillate, the losses associated with the resonant frequency determining network should be lower than the power gain of the oscillator transistor. However, at low current levels, the gain available from the oscillator transistor is lower than the losses in the resonant frequency determining network, and the regenerative operation is not possible.

Therefore, there is an evident and still unsatisfied need for a new micropower RF receiver which is adaptable for operation at extremely low current levels.

SUMMARY OF THE INVENTION

Accordingly, it is an object of the present invention to provide a new RF receiver which addresses the problems associated with conventional superregenerative receivers, and which provides adequate solutions thereto.

It is another object of the present invention to provide a new RF receiver which is adaptable for operation at extremely low current levels, and which has an extremely low power consumption.

It is still another object of the present invention to provide a new superregenerative micropower RF receiver adaptable for use as a wireless receiver of a remote control system, and as a remotely interrogated RF receiver.

It is yet another object of the present invention to provide a new RF receiver adaptable for use with automotive garage door openers, keyless entry systems for automotive, home and commercial security systems, portable and cordless telephones, remote meter reading systems, telemetry systems, medical implants such as pacemakers, remote control devices such as wireless doorbells and furnace thermostats, golf ball tracking, avalanche victim location, and like applications requiring the RF receiver to have an extended useful battery life.

It is a further object of the present invention to provide a new RF receiver that is simple and inexpensive.

It is another object of the present invention to provide a new RF transponder which includes minimal inductive elements.

Briefly, the foregoing and other objects are achieved by providing a new RF receiver which includes an external quench oscillator for generating a series of pulses at a predetermined quench frequency, and a pulse forming network connected to the quench oscillator for converting the series of periodic pulses into a series of exponentially damped drive pulses. An oscillator is connected to, and driven by these drive pulses, and an antenna is connected to the oscillator for receiving modulated RF signals.

A signal extraction network is also connected to the oscillator for blocking the quench frequency signals, and for passing the detected RF signals. A micropower amplifier is connected to the signal extraction network for amplifying the detected RF signals. In the preferred embodiment, the oscillator is a Colpitts oscillator which conducts on the negative polarity only, and which is formed of a transistor. An input coupling network is connected between the antenna and the Colpitts oscillator. A logic interface and a data logic circuit are connected to the micropower amplifier for processing the amplified RF signals. The micropower amplifier includes a self-stabilizing amplifier which is comprised of one or more CMOS inverters operated in the linear mode, and a current regulating circuit connected between the power supply and the power supply pin $V_{DD}$, for automatically maintaining the amplifier at a very low current level.

Another embodiment of the RF receiver includes a self-resonant inductor or tuned circuit, typically in the range of 0.1 to 1 microHenry with a resonance frequency on the order of 300 MHz, for defining the operating frequency of the RF receiver, and for receiving modulated RF signals. A slightly forward biased Schottky detector diode is connected between the self-resonant tuned circuit and a micropower amplifier which passes detected audio or data pulses.

Yet another embodiment of the inventive RF receiver includes a receive antenna for receiving RF signals, typically on the order of 300 MHz, and a frequency selecting network, connected to the receive antenna, for determining one or more desired tuning frequencies. A sampling mixer is connected to the frequency selecting network for periodically sampling the modulated RF signals in order to obtain a sampled replica of the RF signals.

The frequency selecting network acts as an impedance matching network, for providing a matched termination to the antenna and a high impedance output to match the average impedance of the sampling circuit. The frequency selecting network has a relatively long unloaded output period wherein it accumulates and stores RF energy during the non-conductive sampling interval, and, at the time of sampling, the stored energy is substantially extracted.

The sampling mixer samples the modulated RF signals at multiples of the sampling frequency, as indicated by the following equation:

$$F(Sig)=F(RF)-nF(LO),$$

where F(Sig) is the detected RF signal frequency; F(RF) is the RF filtering frequency of the frequency selecting network; n is an integer; and F(LO) is the sampling frequency set by a local oscillator, typically on the order of 300 KHz.

Typically, the sampling mixer is formed of two Schottky diodes in a common cathode configuration, such that a local oscillator gate pulse is fed to the common cathode of these Schottky diodes. A pulse generator is driven by the local oscillator for increasing the switching speed of the square wave oscillation signal. A pulse forming network is connected between the pulse generator and the common cathode of the Schottky diodes for converting the oscillation square wave signal at the output of the pulse generator into a high peak current signal with a fast rise time and an exponentially decaying tail.

The foregoing receivers can be made part of a transponder for use in a variety of applications, such as in automotive garage door openers, keyless entry systems, portable and cordless telephones, remote meter reading systems, telemetry systems, medical implants, and remote control devices.

BRIEF DESCRIPTION OF THE DRAWINGS

The above and other features of the present invention and the manner of attaining them, will become apparent, and the invention itself will be best understood, by reference to the following description and the accompanying drawings, wherein:

FIGS. 4A through 4C illustrate various designs for a micropower amplifier used in the RF receiver of FIGS. 1 and 2;

FIG. 5 is a block diagram of a transponder comprising the RF receiver of FIGS. 1, 6 and 7;

DETAILED DESCRIPTION OF THE PREFERRED EMBODIMENTS

Figure 1:
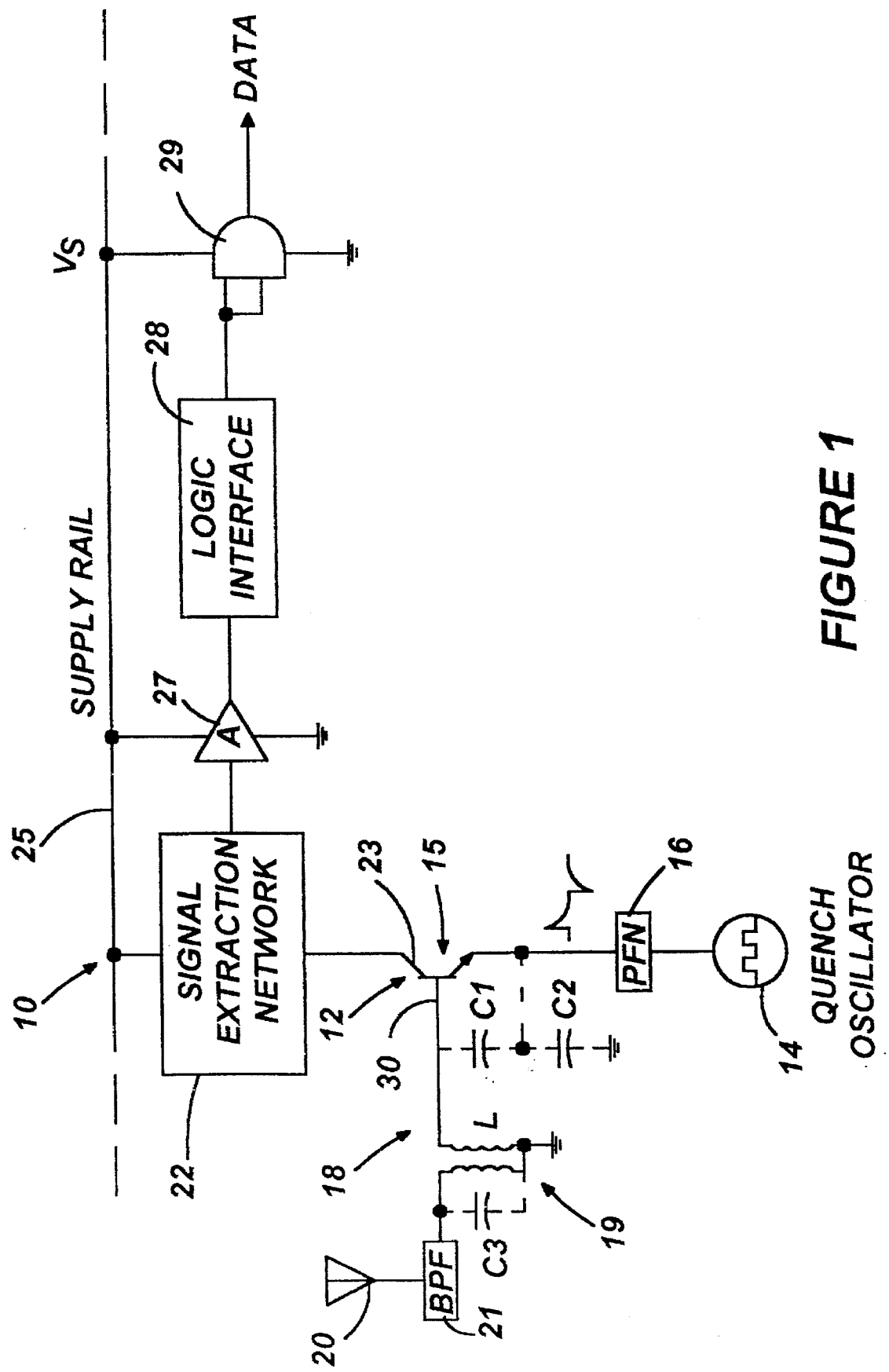
FIG. 1 is a circuit diagram in a block diagram form of an RF receiver according to the present invention.

FIG. 1 illustrates a circuit diagram of an RF receiver 10 according to the present invention. The receiver 10 generally includes a Colpitts oscillator 12 which is pulsed, or quenched by an external square wave quench oscillator 14 operating at a predetermined frequency, such as 50 KHz. A pulse forming network (PFN) 16 is connected between the quench oscillator 14 and the Colpitts oscillator 12 to supply an exponentially damped drive pulse to the Colpitts oscillator 12, which conducts on the negative polarity only. The Colpitts oscillator 12 is formed of a transistor 15 and the internal capacitance C1 and C2 (shown in broken lines) of the transistor 15.

The frequency of the quench oscillator 14 is optimized to the Q of an RF tuned circuit 18 defined by the inductance L of an input coupling network 19 which could be a part of an antenna 20, and the internal capacitances C1 and C2. The frequency of the quench oscillator 14 is also optimized to the RF oscillations. A bandpass filter 21 is generally comprised of an LC network, which may include a parasitic capacitance C3 and the inductance L, and is connected between the antenna 20 and the input coupling network 19. A helical resonator or a surface acoustic wave (SAW) filter (not shown) may optionally be inserted between the antenna 20 and the input coupling network 19, to further increase the signal selectivity.

Since the Colpitts oscillator 12 is repeatedly stopped and resynchronized by the quench oscillator 14, whenever a modulated RF signal is received by the antenna 20, a signal related current is caused to flow into a signal extraction network 22 connected between the collector 23 of the transistor 15 and a power supply rail 25. The signal extraction network 22 blocks the RF and quench frequencies, and passes the lower modulation frequency signals.

A micropower amplifier 27 receives these modulation frequency signals from the signal extraction network 22, amplifies and passes them to a logic interface 28, and therefrom to a data logic circuit, such as a standard CMOS logic circuit 29 for data processing.

Unlike conventional circuits that use a sinusoidal quench waveform, the receiver 10 uses damped exponential signals generated by the pulse forming network 16. These damped exponential signals particularly enable the operation at very low current levels. Additionally, with the base 30 of the transistor 15 at ground potential through the input coupling network 19, the full voltage of the supply rail 25 appears across the base-collector junction of the transistor 15 for optimum operation. The receiver 10 uses fewer components than conventional receivers, and eliminates the traditional bulky inductors used in quench oscillators.

Figure 2:
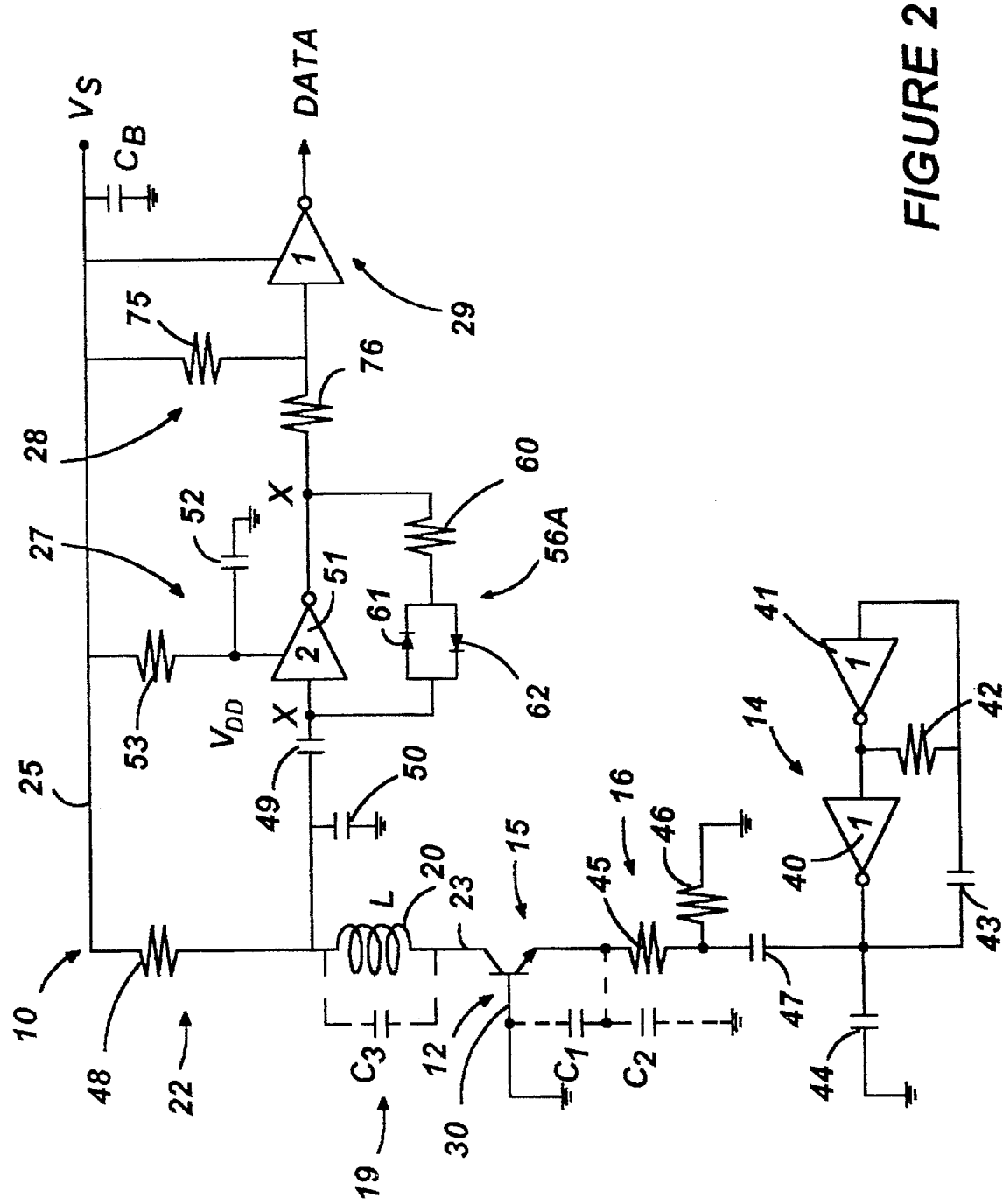
FIG. 2 is a more detailed circuit diagram of a first embodiment of the RF receiver of FIG. 1.

FIG. 2 is a more detailed circuit diagram of a first embodiment of the RF receiver 10 illustrated in FIG. 1. The circuit diagram in FIG. 1 is different from the circuit diagram in FIG. 2 in that the input coupling network 19 is connected to the base 30 of the transistor 15 in FIG. 1, while it is shown connected to the collector 23 in FIG. 2. Such difference is presented for illustrating the various design possibilities of the circuit diagram, with the preferred embodiment being illustrated in FIG. 2. The input coupling network 19 in the preferred embodiment also serves as the receive antenna.

In order for the Colpitts oscillator 12 to oscillate, the power losses associated with the resonant frequency determining network comprised of the input coupling inductance L, the parasitic capacitance C3, and the internal capacitors C1 and C2, should be lower than the power gain of the oscillator transistor 15. For this purpose, the quench oscillator 14 is placed externally relative to the Colpitts oscillator 12. The resonant frequency determining network uses the parasitic capacitance C3 and the internal capacitances C1 and C2 of the transistor 15 as the feedback path in order to minimize losses associated with additional external capacitances.

The superregenerative oscillator/receiver does not include a separate quench oscillator inductor. For this purpose, the quench oscillator 14 is formed of CMOS inverters using resistors and capacitors to determine the oscillation frequency. Furthermore, in order to achieve a very low operating power, minimal capacitance elements are used in the circuit design, by using the intrinsic parasitic capacitance of the transistor 15 and the distributed parasitic capacitance C3 of the input coupling network 19.

In the preferred embodiment, the quench oscillator 14 generally includes two inverters 40, 41 (I1=74HC04) connected in series; a resistor 42 (R=4.7 megohms); a capacitor 43 (C=2 picofarads) connected between the output of the inverter 40 and the resistor 42; and another capacitor 44 (C=33 picofarads) connected between the output of the inverter 40 and ground. The pulse forming network 16 includes a first resistor 45 (R=1 kilohms) connected at one end to the emitter of the transistor 15 and at the other end to a second resistor 46 (R=47 kilohms) and a capacitor 47 (C=33 picofarads). The resistor 46 is grounded, and the capacitor 47 is connected to the output of the inverter 40.

The signal extraction network 22 includes a resistor 48 (R=220 kilohms) connected between the supply rail 25 and the input coupling network 19. It further includes a coupling capacitor 49 (C=0.1 microfarad) connected between the input coupling network 19 and the amplifier 27; and a bypass capacitor 50 (C=44 picofarads) connected between the resistor 48 and ground. The signal extraction network 22 blocks the RF signals from the Colpitts oscillator 12 from being coupled to the amplifier 27, while passing the lower frequencies which correspond to the data to be output by the receiver 10. The envelope representing the desired data signal appears at the output of the signal extraction network 22, and is illustrated in FIG. 3E.

FIGS. 4A, 4B, 4C show three exemplary alternative designs for the micropower baseband amplifier 27. It should be clear that other designs are also possible. An important feature of the amplifier 27 is the inclusion of a current regulating circuit between the supply rail 25 ($V_S$) and the power supply pin $V_{DD}$ of an amplifier 51. The current regulating circuit includes a resistor 53 having a very high resistance value (such as 10 megohms) connected between the supply rail 25 ($V_S$) and the power supply pin $V_{DD}$, as well as a bypass capacitor 52 (C=2 microfarads) connected between the power supply pin $V_{DD}$ and ground.

The current regulating circuit automatically maintains the amplifier 51 at a very low current level despite of production variations in the CMOS circuit, temperature variations and the power supply variations. It should be understood that, in an alternative design, the resistor 53 can be replaced with a constant current source without departing from the scope of the present invention.

The amplifier 51 includes one or more conventional CMOS inverters (I2=74HC04 or MC14069) operating in the linear mode. While FIG. 4A illustrates multiple CMOS inverters (i.e., 54, 55), it should be understood that any odd number of inverters can alternatively be selected.

In order to cause these inverters 54, 55 to operate in the linear mode, an external feedback resistive path 56A is provided between the output and input of the amplifier 51, i.e., between points X—X. This resistive path can be designed in a multitude of ways, three of which are illustrated in FIGS. 4A, B, and C, and referenced by 56A, 56B and 56C, respectively. These external feedback resistive paths cause the inverters 54, 55 to operate in a linear mode, and further cause the output voltage of the amplifier 51 to be equal to $V_{DD}/2$.

The feedback path 56A is illustrated as the preferred mode in FIGS. 2 and 4A. It includes a resistor 60, having a resistance of about 22 megohms, which is connected in series with two diodes 61, 62 (D=1N4148). These diodes 61, 62 are connected in parallel to provide a highly resistive path 63. The feedback path 56B includes two resistors 65, 66, each having a resistance of about 22 megohms connected in series, and a ground path connected to the resistors 65, 66 and comprised of a resistor 67 (R=1 megohm) and a capacitor 68 (C=0.1 microfarad) connected in series. The feedback path 56C includes a resistance having a very high resistance, for instance R=44 megohms.

Turning to FIG. 2, the logic interface 28 functions as a voltage level translator, and centers the swing of the output amplifier 27 on the threshold of the logic circuit 29. The logic interface 28 includes a first resistor 75 (R=22 megohms) connected between the supply rail 25 and the input of the logic circuit 29; and a second resistor 76 (R=10 megohms) connected between the amplifier 27 and the input of the logic circuit 29. The logic circuit 29 includes an inverter (I1=74HC04). A bypass capacitor $C_B$ (C=10 microfarads) is connected between the supply rail 25 and ground, for high frequency stability.

Figure 3A:
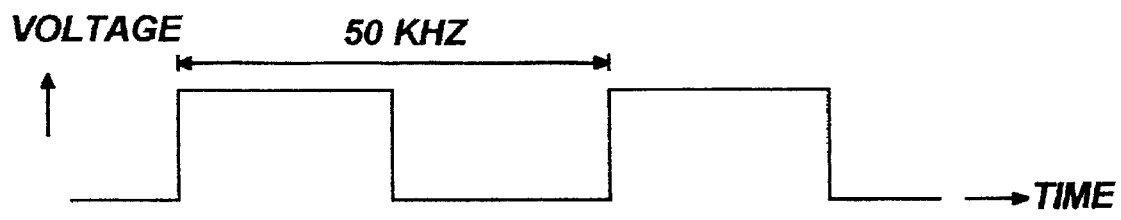
FIGS. 3A through 3E illustrate various waveforms at different stages of the RF receiver of FIGS. 1 and 2.
Figure 3B:
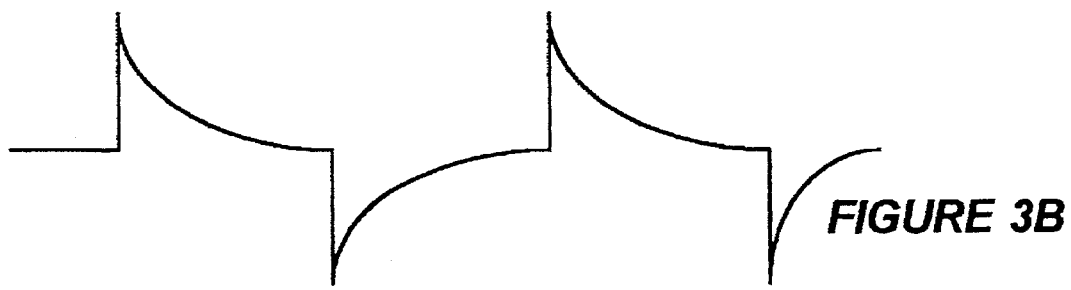

FIG. 3A shows one period of the square wave oscillation signal of the quench oscillator 14, which is supplied to the pulse forming network 16. As illustrated in FIG. 3B, the pulse forming network 16 acts as a differentiator and converts the square wave oscillation signal in FIG. 3A into a high peak current signal with a fast rise time and an exponentially decaying tail, and supplies it to the Colpitts oscillator 12. During the fast rise time, i.e., periods of high peak current (0.1–1 mA), the Colpitts oscillator 12 is made to oscillate, because the high peak current values increase the transconductance of the transistor 15, which supports oscillation. However, at some point during the decaying tail in FIG. 3B, the Colpitts oscillator 12 is quenched. The quench oscillator 14 oscillates at very low current levels, but at the same time provides high peak current spikes to drive the Colpitts oscillator 12.

Figure 3C:
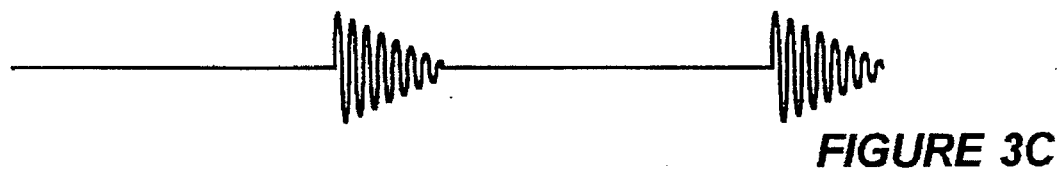

FIG. 3C illustrates that the transistor 15 of the Colpitts oscillator 12 is turned ON, only when the fast rise signal generated by the pulse forming network 16 is negative, and then for a short period of time. The oscillation frequency of the Colpitts oscillator 12 is about 300 MHz. In the present example, the oscillation frequency of the quench oscillator 14 is about 50 KHz, and quenching occurs for about 20 microseconds.

The oscillator 12 oscillates for a brief period of time, and the oscillation will dampen depending on the Q of the RF input coupling network 19. One definition for Q is the number of cycles it takes the oscillation to dampen to about 37%. In the present example, the oscillation period is about 300 nanoseconds (100 cycles×3 nanoseconds per cycle), which represents a small fraction of the total duty cycle of 20 microseconds (i.e., 1.5% of the duty cycle). This provides an important distinctive feature of low power recovery of the input serial data from the RF transmission link as received by the antenna 20.

Figure 3D:
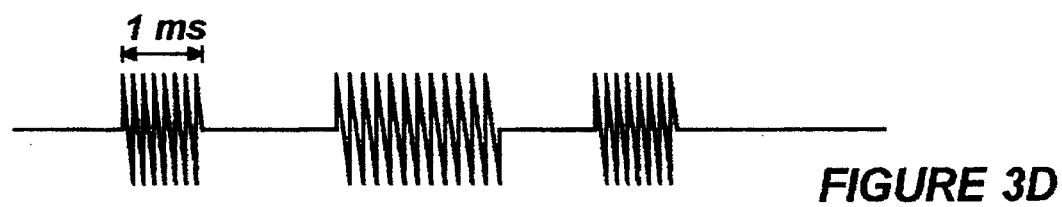
Figure 3E:
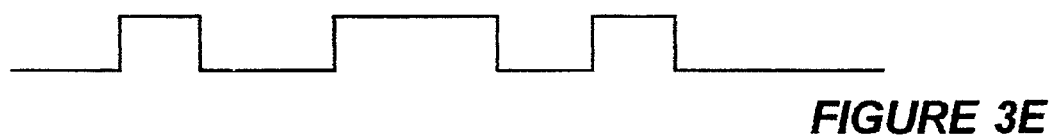

FIG. 3D shows typical pulsed RF waveforms representing digital data, and FIG. 3E shows the recovered data at the output of the receiver 10. FIGS. 3D and E are on a longer time scale than FIGS. 3A, B and C. The pulsed RF signal is synchronously rectified at the base-emitter junction of the transistor 15, where the pulsed oscillations caused by the quench oscillator 14 drive the junction in and out of conduction to provide synchronous rectification with the received RF pulses. The presence of the synchronous RF signal causes an increase in current flow through the transistor 15, which is extracted and applied to the amplifier 27 as data.

Thus designed, the micropower amplifier 27 draws minimal current, on the order of 1 microampere, that is orders of magnitude lower than the current drawn by conventional receivers. The overall function of the micropower amplifier 27 is that of a baseband amplifier, which can serve as an audio or data amplifier. The amplification factor of the illustrated micropower amplifier is about 1000.

One important problematic phenomenon facing conventional receivers, and addressed by the present micropower amplifier 27, is totem pole current spiking. This phenomenon is characterized by a high power supply current spike $I_{DD}$ drawn when the output of voltage is at $V_{DD}/2$. This current spike can range between 40 to 50 milliamperes, and can cause the power supply, i.e., a battery to be prematurely drained. By decreasing the voltage $V_{DD}$, the current spike is also decreased, and the amplification factor remains generally constant. The present micropower amplifier 27 operates at a very low voltage $V_{DD}$ due to the current regulating circuit 48, and thus draws a minimal current and consumes minimal power.

The inventive feature of the present invention is exemplified by low power consumption of the receiver 10. In the foregoing illustration, one alkaline battery ($V_S$=1.5 volt) used as a power source, is expected to last about 30 years, but is practically limited by the battery's own shelf life.

FIG. 5 is a block diagram of a transponder 80 comprising the RF receiver 10 of FIG. 1. The transponder 80 includes a receiving antenna, such as the antenna 20 (FIG. 1) connected to the RF receiver 10. It should be noted that the antenna 20 can be a part of the receiver 10. The data at the output of the receiver 10 is conveyed to a data processing network 82, which processes the data and feeds the processed information back to a transmitter 84, for transmission over a transmitting antenna 86. The transmitter 84 can be a conventional transmitter operating at a low duty cycle for low average power consumption.

In one exemplary application for the transponder 80, the data pulses generated by the receiver 10 are decoded by the data processing network 82, which provides an acceptance code identifying the validity of the user's authorization to use the transponder 80. The data processing network 82 may generate a query to the user's unit, and sends such query over the transmitting antenna 84. The user's unit then automatically responds to the query and transmits the response to the transponder 80, which validates the accuracy of such response by means of a look-up table. In some applications, the external DATA can include codes to or from various instruments. The transmitter 84 is normally OFF.

Figure 6:
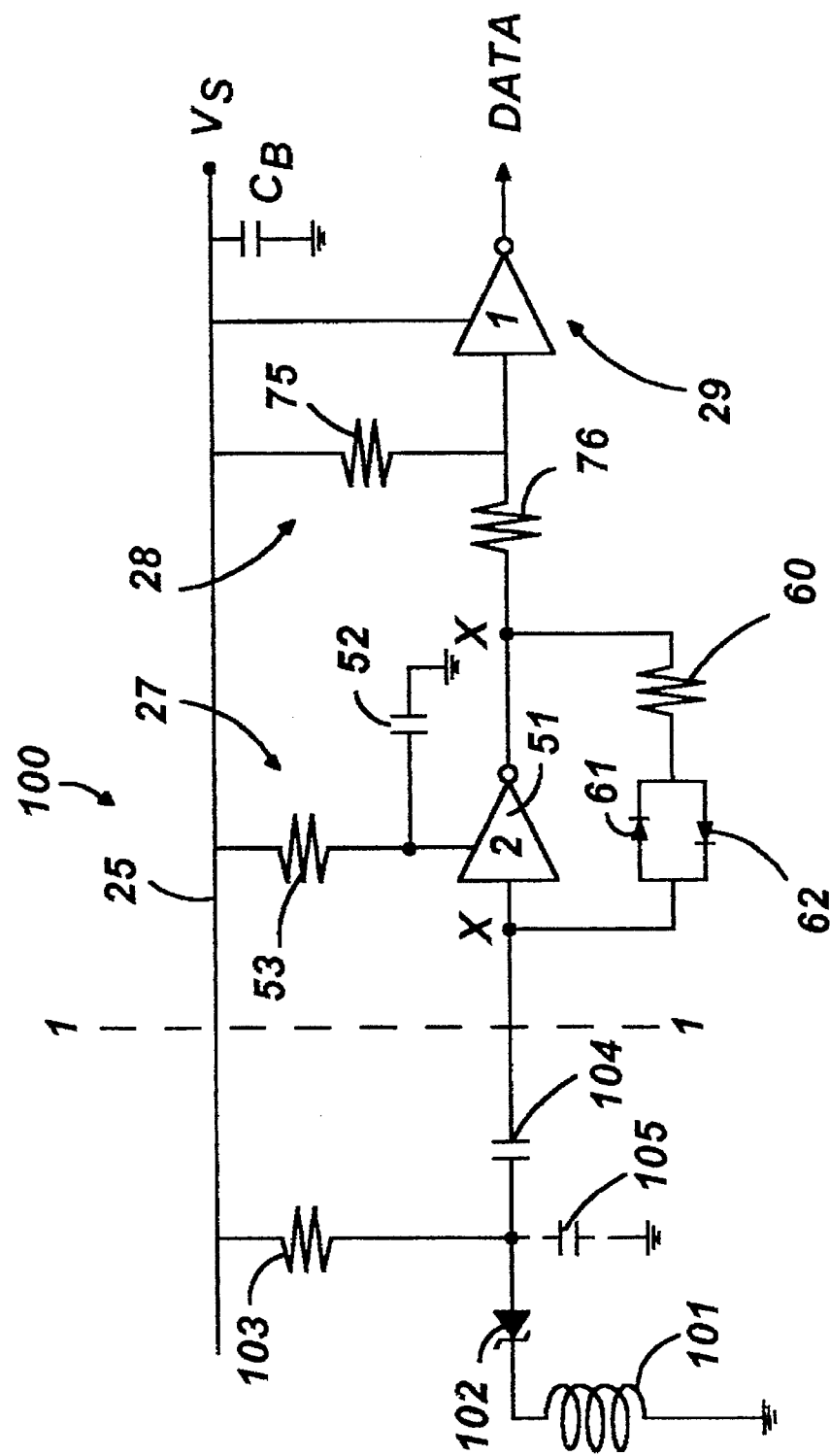
FIG. 6 is a circuit diagram of a second embodiment of the RF receiver according to the present invention.

FIG. 6 is a circuit diagram of a second embodiment of an RF receiver 100 according to the present invention. The receiver 100 generally includes two circuit sections, one on each side of the line 1—1. The circuit to the right of line 1—1 is similar to the circuit in FIG. 1, and therefore it will not be described again. The circuit to the left of line 1—1 includes a self resonant circuit 101, typically in the range of 0.1 to 1 microHenry with the resonance frequency on the order of 300 MHz. The resonant circuit 101 defines the operating frequency of the receiver 100, and also serves as an antenna in some applications. The input coupling network 19 in FIG. 1 can be applied to improve the selectivity of the receiver 100.

The receiver 100 further includes a Schottky diode 102 that is slightly forward biased (typically 0.3 volt) by a resistor 103 (R=2.2 megohms). Such forward bias places the operating point of the diode 102 on the diode IV curve in a region where useful rectification occurs at very low signal levels. Since the IV curve is non-linear in nature, as the incoming RF signal varies the voltage across the diode 102, the change in the corresponding diode current is predominantly unipolar, namely the upward current swing is greater than the downward current swing, and the resulting average signal ΔI is non-zero, i.e., positive. This current change ΔI causes a slight shift in the forward voltage ΔV, which is coupled by a capacitor 104 (C=0.47 microfarad) connected between the diode 102 and the input of the amplifier 27. The voltage ΔV is the detected RF signal.

A stray capacitor 105 (shown in broken lines) averages the rectified RF pulses. The capacitor 104 is a DC blocking capacitor that blocks the DC components from passing to the amplifier 27, but passes the data pulses. The DC components are removed so that the amplifier 27 is not driven into saturation.

The receiver 100 can be less sensitive and less selective than the receiver 10 of FIG. 2, but it consumes much less energy. In the foregoing illustration, one alkaline battery ($V_S$=1.5 volt) used as a power source, is expected to last about 300 years, but is practically limited by the battery's own shelf life.

Figure 7:
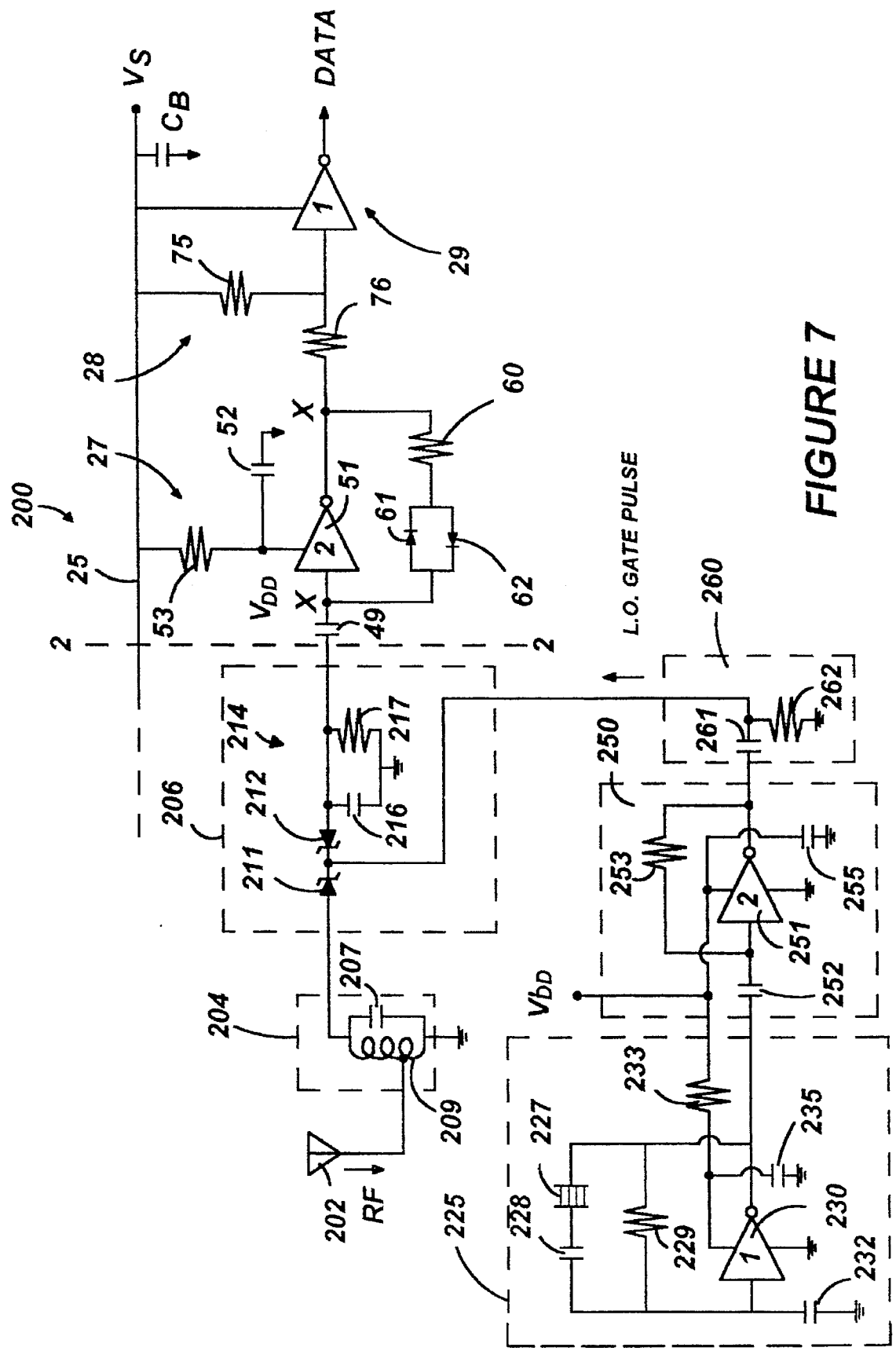
FIG. 7 is a circuit diagram of a third embodiment of the RF receiver according to the present invention.

FIG. 7 is a circuit diagram of a third embodiment of an RF receiver 200 according to the present invention. The receiver 200 generally includes two circuit sections, one on each side of line 2—2. The circuit to the right of line 2—2 is similar to the circuit in FIG. 2, and therefore it will not be described again. The circuit to the left of line 2—2 generally includes a receive antenna 202 for receiving RF signals typically on the order of 300 MHz.

The received signals are applied to a frequency selecting network (FSN) 204, which determines the desired tuning frequency or frequencies, and which feeds the RF signals to a sampling mixer 206. The FSN 204 acts as a filter and allows only one or a range of RF frequencies to pass through. The FSN 204 is generally formed of a resonant LC circuit comprising a capacitor 207 (C=5 picofarads) connected in parallel to a tapped inductor 209. This LC circuit acts as an impedance matching network, to provide a matched termination to the antenna impedance (typically 75 ohms), and to further provide a high impedance output to match the average impedance of the sampling mixer 206 (typically 10 kilohms).

This impedance matching allows optimum power transfer to occur. Additionally, the present FSN 204 has a relatively long unloaded output period, such that it accumulates and stores energy during the non-conductive sampling interval. At the time of sampling, a very low impedance is effectively placed across the FSN 204, which causes the stored energy to be substantially extracted. Thus, the FSN 204 provides a highly efficient mixer relative to an unmatched mixer.

The sampling mixer 206 periodically samples the RF signals to obtain a sampled replica of the RF signal, which carries the audio or data information to be conveyed over the transponder link. This replica is the detected RF signal. The sampling mixer 206 samples the received RF signals at multiples of the sampling frequency, as indicated by the following equation:

$$F(Sig)=F(RF)-nF(LO),$$

where F(Sig) is the detected RF signal frequency; F(RF) is the RF filtering frequency of the FSN 204; n is an integer; and F(LO) is the sampling frequency set by the local oscillator frequency (typically 300 KHz). The audio/data bandwidth ranges between 0 and 10 KHz, while the RF frequency ranges between 0 and 500 MHz.

The sampling mixer 206 comprises two Schottky diodes 211, 212 in a common cathode configuration. The anode of the diode 212 is connected to a low-pass filter 214 for smoothing the audio and/or data signals at the output of the Schottky diodes 211, 212, and for rejecting the RF and local oscillator components. The low-pass filter 214 is comprised of an RC circuit formed of a capacitor 216 (C=100 picofarads), and a resistor 217 (R=1 megohm) that are connected in parallel between the anode of the Schottky diode 212 and ground. The local oscillator gate pulse is fed to the common cathode of the Schottky diodes 211, 212 in order to periodically drive them into conduction and thereby sample the RF signal from the FSN 204. The output of the sampling mixer 206 is then fed to the amplifier 27 via the coupling capacitor 49 (C=0.001 microfarad).

The receiver 200 further includes a local oscillator 225 for generating typically a 300 KHz square wave or other desired oscillation frequencies, by means of a crystal 227. The crystal 227 is connected in series to a capacitor 228 (C=33 picofarads), across a shunt resistor 229 (R=10 megohms) and across the input and output terminals of an inverter 230 (I1=74AC04). A capacitor 232 (C=22 picofarads) is connected between the input of the inverter 230 and ground. The supply pin of the inverter 230 is connected to a power supply $V'_{DD}$, via a resistor 233 (R=47 kilohms). The voltage of the power supply $V'_{DD}$ ranges between 1.1 and 1.9 volts, with a typical value of 1.5 volts. A shunt capacitor 235 (C=0.1 microfarad) is connected between the supply pin of the inverter 230 and ground.

The oscillation signal is applied to a pulse generator 250, which provides the square wave oscillation signal with sharper edges, by decreasing the rise time of that signal. To this end, the pulse generator 250 includes an inverter 251 (I2=74AC04) whose input is connected to the output of the inverter 230, via a capacitor 252 (C=1 nanofarad). A shunt to the power supply $V'_{DD}$ and to ground via a bypass capacitor 255 (C=0.1 resistor 253 (R=10 megohms) is connected between the input and output of the inverter 251. The power supply pin of the inverter 251 is connected farad).

The fast rise time square wave is then fed to a pulse forming network (PFN) 260 comprised of a capacitor 261 (C=2 picofarads) connected between the output of the inverter 251 and the common cathode of the Schottky diodes 211, 212, which, in turn, is connected to a shunt resistor 262 (R=1 kilohm). The function of the pulse forming network 260 is similar to that of the pulse forming network 16 (FIG. 1). The pulse forming network 260 acts as a differentiator and converts the fast rise time square wave signal at the output of the pulse generator 250 into a high peak current signal with a fast rise time and an exponentially decaying tail, as illustrated in FIG. 3B, and applies the latter signal to the common cathode of the Schottky diodes 211, 212. The negative pulses at the output of the pulse forming network 260 bias the sampling mixer 206 and drive it into conduction, causing the sampling of the RF signals received over the antenna 202.

It should be noted that the FSN 204 does not exclusively determine the tuned RF frequency. The main advantages of the receiver 200 are its extremely low power consumption and its ability to define a precise frequency by means of a precise receiving frequency crystal oscillator 227. In the foregoing illustration, one alkaline battery ($V_S$=1.5 volt) used as a power source, is expected to last about 10 years, but is practically limited by the battery's own shelf life.

Some exemplary applications of the present invention include but are not limited to: automotive garage door openers, keyless entry systems for automotive, home and commercial security systems, portable and cordless telephones, remote meter reading systems, telemetry systems, medical implants such as pacemakers, remote control devices such as wireless doorbells and furnace thermostats, golf ball tracking, avalanche victim location, and like applications requiring the RF receiver to have multi-year continuous battery operation.

The foregoing description of the invention has been presented for purposes of illustration and description. It is not intended to be exhaustive or to limit the invention to the precise forms described, and other modifications are possible in light of the foregoing teaching.

What is claimed is:

1. An RF receiver comprising in combination:
   a) an external quench oscillator for generating a series of quench oscillation pulses at a predetermined quench frequency;
   b) an RC pulse forming network connected to said quench oscillator for converting said series of quench oscillation pulses into a series of differentiated exponentially damped drive pulses;
   c) a self-detecting RF oscillator connected to, and driven by said drive pulses;
   d) an antenna, connected to said RF oscillator, for receiving modulated RF signals;
   e) an RC signal extraction network, connected to said RF oscillator, for blocking said quench frequency signals and for passing detected RF signals; and
   f) a micropower amplifier, connected to said signal extraction network for amplifying said detected RF signals.

2. The RF receiver according to claim 1 wherein the RF oscillator comprises a bipolar transistor.

3. The RF receiver according to claim 1 wherein said oscillator is a Colpitts oscillator.

4. The RF receiver according to claim 3 wherein said Colpitts oscillator conducts on one polarity only of said exponentially damped drive pulses, and includes a transistor.

5. The RF receiver according to claim 3 further including an input coupling network connected between said antenna and said Colpitts oscillator.

6. The RF receiver according to claim 5 further including a logic interface and a data logic circuit for processing said amplified and detected RF signals at the output of said micropower amplifier.

7. The RF receiver according to claim 5 wherein said Colpitts oscillator includes a transistor having a collector, an emitter and a base; and wherein said input coupling network is connected to said base.

8. The RF receiver according to claim 5 wherein said Colpitts oscillator includes a transistor having a collector, an emitter and a base; and
   wherein said input coupling network is connected to said collector.

9. The RF receiver according to claim 1 wherein said micropower amplifier includes:

a) a self-stabilizing amplifier comprising one or more inverters operated in the linear mode;

b) a power supply pin $V_{DD}$; and c) a current regulating circuit connected between a power supply and said power supply pin $V_{DD}$, for automatically maintaining said amplifier at a very low current level.

10. The RF receiver according to claim 9 wherein said current regulating circuit includes:

a) a resistor having a very high resistance value connected between said power supply and said power supply pin $V_{DD}$; and b) a bypass capacitor connected between said power supply pin $V_{DD}$ and ground.

11. The RF receiver according to claim 9 wherein said current regulating circuit includes a constant current source connected between said power supply and said power supply pin $V_{DD}$.

12. The RF receiver according to claim 9 wherein said micropower amplifier further includes a highly resistive feedback path between the output and input of said self-stabilizing amplifier for causing it to operate in a linear mode.

13. An RF receiver comprising in combination:

a) a receive antenna for receiving RF signals;

b) a frequency selecting network, connected to said receive antenna, for determining one or more desired tuning frequencies;

c) a sampling mixer connected to said frequency selecting network and having an average impedance, for periodically sampling said RF signals to obtain a sampled replica of said RF signals;

d) said frequency selecting network acting as an impedance matching network, for providing a matched termination to said antenna and a high impedance output to match said average impedance of said sampling mixer;

e) said frequency selecting network having a relatively long unloaded output period and a long non-conductive sampling interval, whereby said frequency selecting network accumulates and stores energy during said non-conductive sampling interval, and, at the time of sampling, the stored energy is substantially extracted; and f) a micropower amplifier, connected to said sampling mixer for amplifying said sampled replica signals.

14. The RF receiver according to claim 13 wherein said sampling mixer samples said modulated RF signals at multiples of the sampling frequency, as indicated by the following equation:

$$F(Sig)=F(RF)-nF(LO),$$

where F(Sig) is the modulated RF signal frequency; F(RF) is the RF filtering frequency of said frequency selecting network; n is an integer; and F(LO) is the sampling frequency set by a local oscillator.

15. The RF receiver according to claim 14 wherein said sampling mixer comprises two Schottky diodes in a common cathode configuration, and wherein a local oscillator gate pulse is fed to the common cathode of said Schottky diodes.

16. The receiver according to claim 15 further including a local oscillator for generating a square wave oscillation signal.

17. The receiver according to claim 16 further including a pulse generator, connected to said local oscillator, for decreasing the rise time of said square wave oscillation signal.

18. The receiver according to claim 17 further including a pulse forming network, connected between said pulse generator and the common cathode of said Schottky diodes for converting said oscillation square wave signal at the output of said pulse generator into a high peak current signal with a fast rise time and an exponentially decaying tail.

19. A transponder comprising in combination:

a) a receive antenna for receiving modulated RF signals;

b) an RF receiver connected to said receive antenna;

c) a data processing network for processing data;

d) an RF transmitter for transmitting processed data over a transmit antenna; and e) said RF receiver including:

i) an external quench oscillator for generating a series of pulses at a predetermined quench frequency;

ii) a pulse forming network connected to said quench oscillator for converting said series of periodic pulses into a series of exponentially damped drive pulses;

iii) an oscillator connected to, and driven by said drive pulses;

iv) said receive antenna, connected to said oscillator, for receiving said RF signals;

v) a signal extraction network, connected to said oscillator, for blocking said quench frequency signals and for passing detected RF signals; and vi) a micropower amplifier, connected to said signal extraction network for amplifying said detected RF signals.

20. The transponder according to claim 19 wherein data pulses generated by said receiver are decoded by said data processing network, which provides an acceptance code; and wherein said data processing network generates a query and sends such query over said transmit antenna.

* * * * *